(12) United States Patent
Cooper et al.

(10) Patent No.: US 7,652,479 B2
(45) Date of Patent: Jan. 26, 2010

(54) ELECTROLYTE MEASUREMENT DEVICE AND MEASUREMENT PROCEDURE

(75) Inventors: Kevin R. Cooper, Southern Pines, NC (US); Louie L. Scribner, Southern Pines, NC (US)

(73) Assignee: Scribner Associates, Inc., Southern Pines, NC (US)

( * ) Notice: Subject to any disclaimer, the term of this patent is extended or adjusted under 35 U.S.C. 154(b) by 260 days.

(21) Appl. No.: 11/890,446

(22) Filed: Aug. 6, 2007

(65) Prior Publication Data

US 2009/0039893 A1 Feb. 12, 2009

(51) Int. Cl.
*G01N 27/04* (2006.01)
*G01N 27/407* (2006.01)

(52) U.S. Cl. .......... 324/444; 324/347; 204/421

(58) Field of Classification Search ........ 324/444, 324/439, 425, 324, 323, 347, 354; 204/410, 204/421
See application file for complete search history.

(56) References Cited

U.S. PATENT DOCUMENTS

| | | | | |
|---|---|---|---|---|
| 4,617,518 A | * | 10/1986 | Srnka | 324/365 |
| 4,725,785 A | * | 2/1988 | Converse et al. | 324/559 |
| 4,927,517 A | * | 5/1990 | Mizutani et al. | 204/406 |
| 6,603,314 B1 | * | 8/2003 | Kostelnicek et al. | 324/368 |
| 7,071,684 B2 | | 7/2006 | Red'ko et al. | |
| 2001/0023614 A1 | * | 9/2001 | Tubel et al. | 73/152.39 |

OTHER PUBLICATIONS

G. Alberti, Polymeric proton conducting membranes for medium temperature fuel cells (110-160° C), Journal of Membrane Science, 2001, pp. 73-81, vol. 185.

Y. Sone et al., Proton Conductivity of Nafion 117 as Measured by a Four-electrode AC Impedance Method, Journal of The Electrochemical Society, Apr. 1996, pp. 1254-1259, vol. 143.

Z. Xie et al., Discrepancies in the Measurement of Ionic Conductivity of PEMs Using Two- and Four-Probe AC Impedance Spectroscopy, Journal of The Electrochemical Society, 2006, pp. E173-E178, vol. 153, No. 10.

S. Ma et al., Anisotropic Conductivity Over In-Plane and Thickness Directions in Nafion-117, Journal of The Electrochemical Society, 2006, pp. A2274-A2281, vol. 153, No. 12.

R. Makharia et al., Measurement of Catalyst Layer Electrolyte Resistance in PEFCs Using Electrochemical Impedance Spectroscopy, Journal of The Electrochemical Society, 2005, pp. A970-A977, vol. 152, No. 5.

(Continued)

*Primary Examiner*—Hoai-An D Nguyen
(74) *Attorney, Agent, or Firm*—Nelson Mullins Riley & Scarborough LLP

(57) ABSTRACT

A method and apparatus for measuring the through-thickness resistance or conductance of a thin electrolyte is provided. The method and apparatus includes positioning a first source electrode on a first side of an electrolyte to be tested, positioning a second source electrode on a second side of the electrolyte, positioning a first sense electrode on the second side of the electrolyte, and positioning a second sense electrode on the first side of the electrolyte. current is then passed between the first and second source electrodes and the voltage between the first and second sense electrodes is measured.

28 Claims, 2 Drawing Sheets

OTHER PUBLICATIONS

W.B. Johnson et al., Ionic Conductivity of Perfluorosulfonic Acid Membranes as a Function of Temperature, Humidity and Equivalent Weight, Electrochemical Society Proceedings vol. 2002-5, pp. 132-141, Copyright 2002, published by the Electrochemical Society, Inc., Pennington, NJ.

F. Büchi et al., In-situ resistance measurements of Nafion® 117 membranes in polymer electrolyte fuel cells, Journal of Electroanalytical Chemistry, 1996, pp. 37-43, vol. 404.

R.F. Silva et al., Tangential and normal conductivities of Nafion® membranes used in polymer electrolyte fuel cells, Journal of Power Sources, 2004, pp. 18-26, vol. 134.

C.L. Gardner et al., Measurement of membrane conductivities using an open-ended coaxial probe, Journal of Electroanalytical Chemistry, 1995, pp. 67-73, vol. 395.

J. J. Summer et al, Proton Conductivity in Nafion® 117 and in a Novel Bis[(perfluoroalkyl)sulfonyl]imide Ionomer Membrane, Journal of The Electrochemical Society, Jan. 1998, pp. 107-110, vol. 145.

* cited by examiner

ELECTROLYTE MEASUREMENT DEVICE AND MEASUREMENT PROCEDURE

This invention was made with U.S. Government support under Contract No. DE-FG02-06ER84574 awarded by the Department of Energy. The Government has certain rights in this invention.

BACKGROUND OF THE INVENTION

The present invention relates generally to an electrolyte measurement device and measurement procedure. More specifically, the present invention relates to an electrode configuration and method for measuring the through-thickness resistance or conductance of thin liquid, solid, or multi-phase electrolytes.

An electrolyte is an ionically conducting phase used in an electrochemical cell. Thin electrolytes are used in fuel cells, batteries, electrolyzers, dialysis cells, chloro-alkali cells, and ion selective electrode sensors, among others.

An important property of electrochemical cells and electrochemical devices is the resistance of the electrolyte. For example, in electrochemical power devices, electrolyte resistance has implications for performance, efficiency, operating requirements, durability, etc. As such, accurate measurement and characterization of the resistance or conductance of the electrolyte is of scientific and technological importance.

Those having ordinary skill in the art will recognize that resistance and conductance are governed by Ohm's law. Ohm's law states that, in an electrical circuit, the current passing through a conductor from one terminal point on the conductor to another terminal point on the conductor is directly proportional to the potential difference (i.e. voltage drop or voltage) across the two terminal points and inversely proportional to the resistance of the conductor between the two terminal points. In mathematical terms, this is written as:

$$I = \frac{V}{R}$$

where I is the current, V is the potential difference, and R is a constant called the resistance governed by the formula:

$$R=(1/\sigma)\times(L/A)=\rho\times(L/A).$$

As shown in the equation, resistance is a function of the geometry of the system being measured. For example, in the present method, the resistance is a function of (1) the overlap area of the source electrodes (A), (2) the thickness of the electrolyte (L), and (3) the electrolyte conductivity ($\sigma$) or resistivity ($\rho$). Those having ordinary skill in the art will also recognize that conductivity is inversely proportional to resistivity. Stated differently:

$$\sigma=1/\rho.$$

There are two basic approaches to resistance or conductance measurement of thin electrolytes: in-plane and through-thickness. Furthermore, the measurement is typically conducted in either a two-electrode or four-electrode configuration.

In-plane resistance measurement refers to determination of the resistance of the electrolyte in a configuration in which during the measurement the electrical current moves predominantly in the longitudinal and/or transverse direction within the thin electrolyte. This is in contrast to a through-thickness resistance measurement in which during the measurement, the electrical current moves predominantly in the short-transverse (through-thickness) orientation within the thin electrolyte.

Although in-plane resistance measurement is more easily made, it is less desired, because in-plane resistance is not the orientation of interest for most applications (i.e., in application, the direction of ion transport is through the thickness of the electrolyte and not in the plane of the electrolyte). The property of interest, therefore, is the through-thickness resistance of the electrolyte not the in-plane resistance of the electrolyte.

Furthermore, in-plane measurement may provide misleading results for electrolytes that have orientation-dependent intrinsic or effective resistivity or conductivity (i.e., anisotropic and composite material systems). Additionally, some electrolytes have non-uniform resistivity in the through-thickness orientation (e.g., a "skin" region at the surface which has different resistivity than the bulk material) and may respond differently to changes in the test conditions and material processing history. The apparent resistivity or conductivity of electrolytes within non-uniform properties obtained with in-plane measurement approaches may not be representative of the through-thickness resistivity or conductivity and consequently may provide misleading results.

Existing through-thickness measurement techniques also suffer from several drawbacks. For example, in typical two-electrode through-thickness approaches, contact resistance and lead resistance may be on the order of or exceed the electrolyte resistance. This "cell" resistance must be accounted for in order to determine the properties of the electrolyte. To determine the "cell" resistance, one must make measurements of nominally identical electrolytes of different thicknesses. This process is time-consuming, costly, and not always feasible if, for example, electrolytes of different thicknesses are unavailable. One attempt to overcome this unfeasibility was to make stacks of solid electrolytes in order to be able to determine and thus account for the cell resistances in an attempt to back-calculate the electrolyte resistance.

Additionally, charge transfer resistance and double layer capacitance at the electrode-electrolyte interface introduce artifacts that confound measurement of the electrolyte properties in two-electrode configurations. High frequency AC techniques can minimize or eliminate these effects although they typically introduce additional complexity to the measurement.

An alternative, disclosed, four-electrode through-thickness technique relies on embedding the voltage sense electrodes between layers of electrolyte. This may not be feasible under many circumstances due to, for example, lack of material availability, mechanical properties which prohibit layer stacking, such as brittle materials, unknown or unfeasible material processing characteristics required to embed the voltage sense electrodes, errors associated with voltage sense electrode placement, and test article fabrication reproducibility.

Additionally, the processing required to intimately embed the voltage sense electrodes between layers of membrane electrolytes may change the properties of the electrolyte material itself and thus produce erroneous results.

It would be desirable, therefore, to develop an method that permits simple, accurate four-electrode resistance or conductance measurement in the through-thickness direction of thin electrolytes.

SUMMARY OF THE INVENTION

Briefly, therefore, the present invention is a method for four-electrode measurement of the through-thickness resistance or conductance of an electrolyte. The method includes positioning a first source electrode on a first side of an electrolyte to be tested, and positioning a second source electrode on a second side of the electrolyte, wherein the second side is opposite the first side and wherein the first and second source electrodes overlap by some distance. The method further includes positioning a first sense electrode, corresponding to the first source electrode, on the second side of the electrolyte, wherein the first sense electrode is positioned such that it is in contact with the second side of the electrolyte directly opposite the first source electrode and is not in direct physical or electrical contact with the second source electrode. The present method also includes positioning a second sense electrode, corresponding to the second source electrode, on the first side of the electrolyte, wherein the second sense electrode is positioned such that it is in contact with the first side of the electrolyte directly opposite the second source electrode and is not in direct physical or electrical contact with the first source electrode. After the positioning steps, the method further includes passing a DC or AC current between the first and second source electrodes; and measuring the resulting DC or AC voltage between the first and second sense electrodes.

As previously discussed, the first and second source electrodes overlap for some distance. Because the electrolyte is thin relative to the electrode dimensions, the current passing between the two source electrodes is nearly ideally confined to the source electrode overlap area. The source electrodes themselves may have a high electrical conductivity and, therefore, the interfacial potential (potential at electrode-electrolyte interface) is equipotential at all points along the length and width of the source electrode. Because current does not pass through the electrolyte outside the source electrode overlap region, there is no potential gradient in the electrolyte outside the source overlap region. The potential of the electrolyte outside the overlap region, the potential at the source electrode-electrolyte interface, and the potential at the corresponding sense electrode-electrolyte interface is the same. That is, the potential at the voltage sense electrode is essentially identical to the potential at the corresponding source electrode-electrolyte interface. By measuring the voltage between the two sense electrodes, therefore, one is effectively measuring the voltage drop across the electrolyte in the through-thickness orientation that results from application of the driving current between the two source electrodes.

In another aspect, the invention is an apparatus for measuring the through-thickness resistance or conductance of an electrolyte. The apparatus includes a test chamber, a first and second source electrode in close proximity to the test chamber, a first and second sense electrode in close proximity to the test chamber; a gas handling, temperature control and pressure control system in communication with the test chamber for controlling the test chamber environment; and a potentiostat, current/voltage source and/or impedance analyzer for applying a current between the first source electrode and the second source electrode and for measuring the voltage between the first sense electrode and second sense electrode.

These and other aspects of the invention will be understood and become apparent upon review of the specification by those having ordinary skill in the art.

DETAILED DESCRIPTION OF SEVERAL EMBODIMENTS

Reference now will be made in detail to the embodiments of the invention, one or more examples of which are set forth below. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention covers such modifications and variations as come within the scope of the appended claims and their equivalents. Other objects, features and aspects of the present invention are disclosed in or are obvious from the following detailed description. It is to be understood by one of ordinary skill in the art that the present discussion is a description of exemplary embodiments only, and is not intended as limiting the broader aspects of the present invention.

Figure 1:
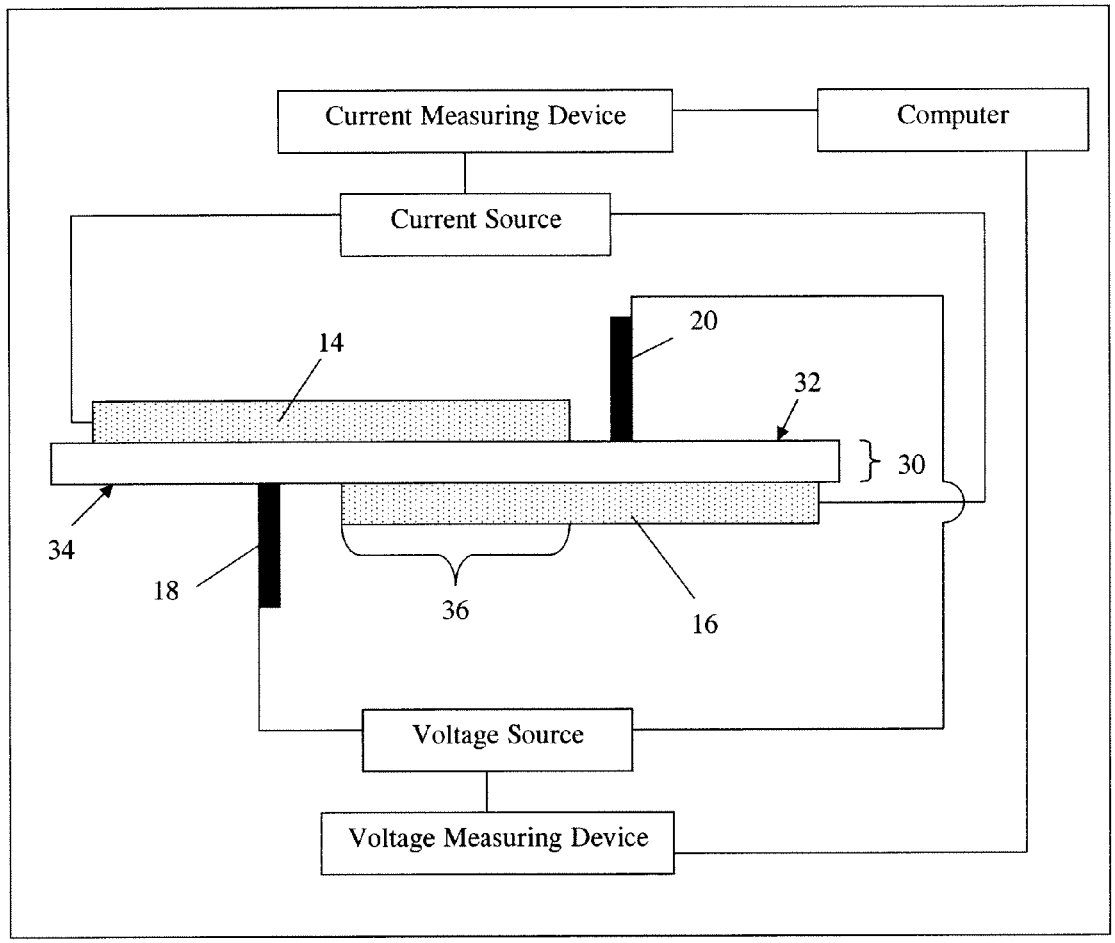
FIG. 1 is a representative illustration of an electrode positioning scheme relative to the electrolyte in accordance with the present invention.

In one aspect, the invention is a method for measuring the through-thickness resistance or conductance of thin electrolytes. FIG. 1 illustrates a positioning scheme for the first and second source electrodes and the first and second sense electrodes in accordance with the present invention. In this embodiment, the first source electrode 14 and second source electrode 16 are positioned adjacent and in contact with an electrolyte 30 to be tested. The first source electrode 14 is positioned adjacent a first side 32 of the electrolyte 30, and the second source electrode is positioned adjacent a second side 34 of the electrolyte 30, such that the first side 32 and the second side 34 are opposite one another. Additionally, the first source electrode 14 is positioned on the first side of the electrolyte 32 and the second source electrode 16 is positioned on the second side of the electrolyte 34 such that there is at least some overlap $36_{[41]}$ of the first source electrode 14 and the second source electrode 16.

The positioning scheme illustrated in FIG. 1 further illustrates a preferred embodiment of the positioning of the first sense electrode 18 and the second sense electrode 20. As illustrated, the first sense electrode 18 may be positioned adjacent the second side 34 of the electrolyte 30 such that the first sense electrode 18 is opposite the first source electrode 14 and is adjacent to, but not in physical or electrical contact with, the second source electrode 16. Similarly, the second sense electrode 20 may be positioned adjacent the first side 32 of the electrolyte 30 such that the second sense electrode 20 is opposite the second source electrode 16 and is adjacent to, but not in physical or electrical contact with, the first source electrode 14.

As used herein, the term "electrolyte" shall be understood to include solid, liquid, or multi-phase electrolytes. For example, the term "electrolyte" may include solid materials such as ion exchange membranes, ionically conductive organic, inorganic and hybrid organic-inorganic materials. In addition, the term "electrolyte" may include aqueous or non-aqueous liquid electrolytes that are free standing or supported in a solid porous, inert, substrate, such as are used in a phosphoric acid or molten carbonate fuel cells, some batteries, and other electrochemical cells. Moreover, the source of the conduction within the electrolyte may be proton, cation, anion, or mixed anion—cation conductance.

The present method includes positioning a first source electrode on a first side of the electrolyte, and positioning a second source electrode on a second side of the electrolyte wherein the second side of the electrolyte is opposite the first side of the electrolyte. The first source electrode and the second source electrode are positioned such that the first and second source electrodes partially, but not completely, overlap.

In some embodiments, the first source electrode and the second source electrode overlap is at least three times greater than the thickness of the electrolyte, in some embodiments at least five times greater than the thickness of the electrolyte, and in some embodiments at least ten times greater than the thickness of the electrolyte.

In one embodiment, the width of the first and second source electrodes is independently at least about three times the thickness of the electrolyte to be tested.

The present method further includes positioning a first sense electrode in physical contact with the electrolyte and opposite the first source electrode. The first sense electrode may be positioned on the second side of the electrolyte directly opposite the first source electrode, and may be adjacent to, but not in physical or electrical contact with, the second source electrode.

The present method further includes positioning a second sense electrode in physical contact with the electrolyte and opposite the second source electrode. The second sense electrode may be positioned on the first side of the electrolyte directly opposite the second source electrode, and may be adjacent to, but not in physical or electrical contact with, the first source electrode.

The distance between the first sense electrode and the second source electrode, as well as the distance between the second sense electrode and the first source electrode may be at least about three times the thickness of the electrolyte, at least about five times the thickness of the electrolyte, and/or about ten times the thickness of the electrolyte. The maximum distance between the first sense electrode and the second source electrode, as well as the maximum distance between the second sense electrode and the first source electrode is governed by practicality, i.e., manufacturing limitations and electrolyte size.

In some embodiments, the first and second sense electrodes may be in the form of wires. As used herein, the term "wires" shall be understood to include an electrical conductor that has a small cross-section. In some embodiments, the wire may be round in cross-section, but the wire, as used herein, is not limited to any particular geometry. Stated differently, the cross-section of the wire may be in the form of, but not limited to, circular, elliptical, square, and rectangular. Similarly, the wire may be in the form of a tube, wherein the cross-section forms a ring-like geometry. Those having ordinary skill in the art will recognize that the cross-section of the contemplated wires may be of any geometry known in the art. In all embodiments, a cross-section of the first and second sense electrodes should be smaller than the width of the first and second source electrodes.

In some embodiments, the first and second sense electrodes are wires independently having a diameter of at least about one micron, between about 1 µm and about 3 mm, and/or between about 50 µm and about 1 mm.

The maximum width of the first and second sense electrodes may, in some embodiments, be less than about ⅓ the width of the first and second source electrodes, less than about ⅕ the width of the first and second source electrodes, and/or less than about 1/10 the width of the source electrodes.

In certain embodiments, the electrolyte to be tested has a thickness that is less than about ⅓ the distance between the first sense electrode and the second source electrode. Stated differently, the distance between the second source electrode and the first sense electrode may be at least about three times the thickness of the electrolyte to be tested.

The first and second source electrodes and the first and second sense electrodes may be non-reactive electrical conductors. The electrodes may be independently selected from the group consisting of platinum, palladium, gold, silver, nickel, ruthenium, alloys thereof, carbon paper, carbon cloth, solid carbon, graphitic carbon, platinum-carbon composite, and combinations thereof. Furthermore, the electrodes may independently be selected from solid and porous electrodes.

After the electrode positioning steps, the method may further include passing a DC or AC current between the first and second source electrodes and measuring the resulting DC or AC voltage between the first and second sense electrodes. In the DC case, applying Ohm's law, the DC voltage measured with the sense electrodes and the applied DC current between the source electrodes enables determination of the through-thickness resistance or conductance of the electrolyte in accordance with the present invention. In the AC case, the AC voltage between the first and second sense electrodes and the AC current between the first and second source electrodes enables determination of the impedance of the electrolyte, which can be equated to the resistance, in the through-thickness direction in accordance with the present invention.

In accordance with the present invention, when a DC or AC voltage is passed between the first and second source electrodes to measure the through-thickness conductance and/or resistance of an electrolyte, the voltage may be between about +/−1 mV and about +/−20 V, and/or between about +/−10 mV and about +/−1 V.

In accordance with the present invention, when a DC or AC current is passed between the first and second source electrodes to measure the through-thickness conductance and/or resistance of an electrolyte, the current may be between about +/−1 nA and about +/−100 A, and/or between about +/−1 µA to about +/−1 A.

In another aspect, the invention is an apparatus including a first and second source electrode, a first and second sense electrode, a potentiostat, an impedance analyzer, and/or other current source for applying a current between the first source electrode and the second source electrode and for measuring the voltage between the first sense electrode and the second sense electrode.

Those having ordinary skill in the art will recognize that known current and voltage sources, and current and voltage measurement devices, are useful in accordance with the present invention. The present apparatus is not limited to any particular current source or current/voltage analyzer. Accordingly, known instruments for supplying and/or analyzing a current and/or voltage are contemplated as useful and the invention is not limited to any particular instrument for supplying and/or analyzing a DC or AC current and/or DC or AC voltage.

Figure 2:
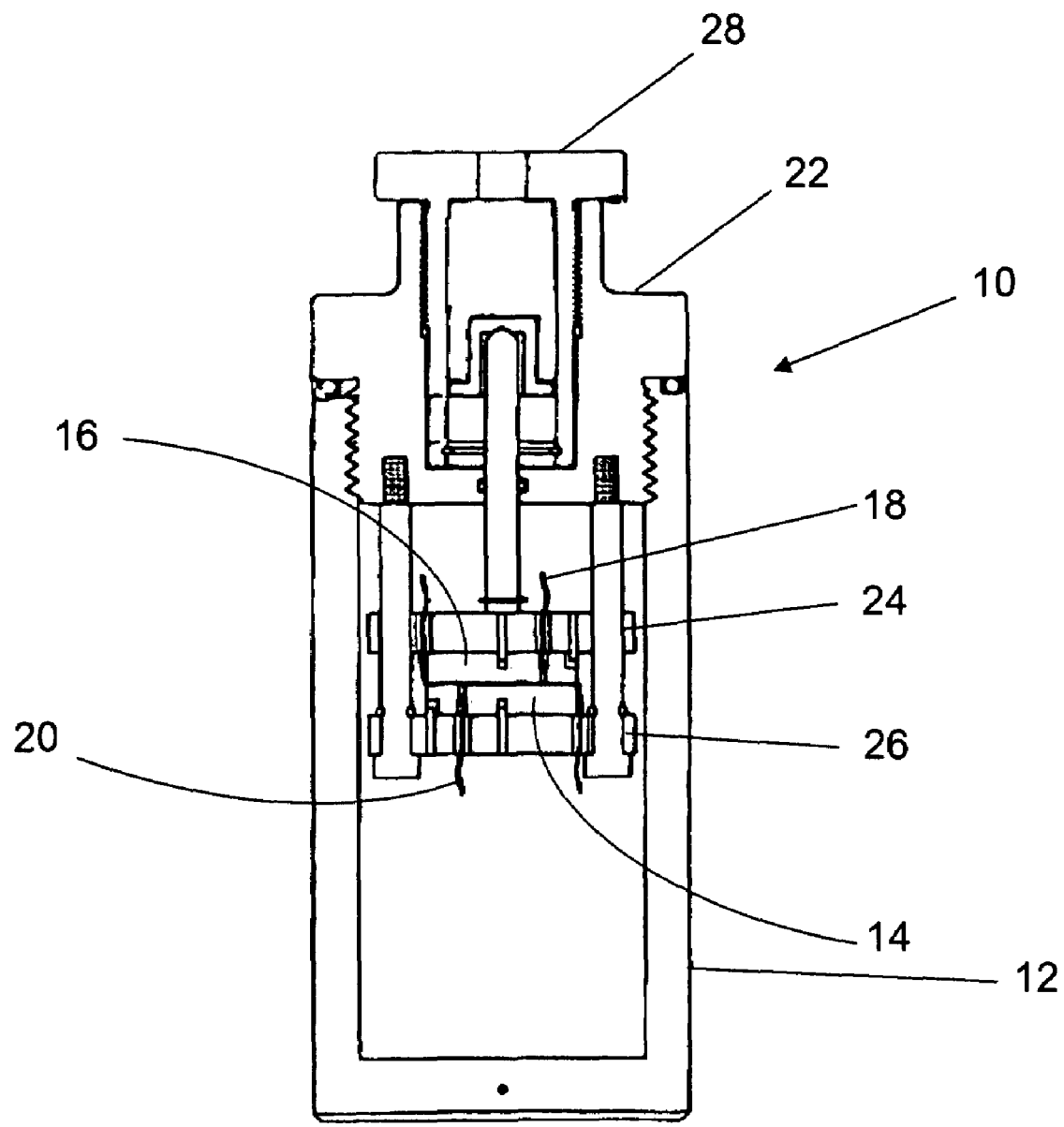
FIG. 2 is a representative illustration of an apparatus in accordance with one embodiment of the present invention.

In another aspect, as depicted by an embodiment in FIG. 2, the invention is an apparatus 10 for measuring the through-thickness resistance or conductance of an electrolyte (not shown). Exemplary electrolytes contemplated as capable of being tested in the present apparatus include one or more of solid, liquid, or multi-phase electrolytes, such as those discussed above.

The apparatus 10 of FIG. 2 includes a test chamber 12, a first source electrode 14 in close proximity to the test chamber 12, and a second source electrode 16 in close proximity to the test chamber 12. The apparatus also includes a first sense electrode 18 and a second sense electrode 20 in close proximity to the test chamber 12, and a gas handling system, temperature control system and pressure control system (not shown) for controlling a test chamber environment.

Furthermore, the measurement system may further include a potentiostat and/or impedance analyzer or other voltage/current source (not shown) for applying a DC or AC current between the first source electrode 14 and the second source electrode 16, and measuring the DC or AC voltage between the first sense electrode 18 and the second sense electrode 20.

As used herein, the term "close proximity" is intended to include the space within the test chamber, as well as areas outside the test chamber, wherein the components in "close proximity" to the test chamber may be positioned inside the test chamber during operation of the apparatus, but may be removed from the test chamber during periods of little to no activity in the test chamber and for positioning of the source and sense electrodes adjacent to and in contact with the electrolyte as described previously.

In some embodiments, the apparatus 10 further comprises a host computer (not shown) in communication with the apparatus 10 for controlling and monitoring the apparatus 10. It may be desirable for the host computer to be in sufficient communication with the apparatus 10 to enable automatic and/or preprogrammed control of the apparatus 10.

The test chamber 12 of the present apparatus 10 may further include one or more of a gas inlet (not shown), a dew point or other humidity sensor (not shown), temperature sensors (not shown), and a cell head 22. Where a cell head 22 is included in the test chamber 12, the cell head may include one or more of integrated electrode holders 24, 26 and specimen holders (not shown), an electrode-sample clamping mechanism (28) and/or temperature sensors (not shown). Those having ordinary skill in the art will recognize that when a liquid or semi-liquid electrolyte is being tested, it may be necessary to include a form for containing the liquid or semi-liquid electrolyte. In this situation, the electrodes may be integrated into or placed adjacent the outside of the form and the electrodes are electrically isolated from the form, or may be placed adjacent the inside of the form, in direct contact with the liquid or multi-phase electrolyte being tested.

As discussed above, each of the first and second source electrodes 14, 16 and the first and second sense electrodes 18, 20 is independently selected from non-reactive electrical conductors. Exemplary non-reactive electrical conductors include one or more of platinum, palladium, gold, silver, nickel, ruthenium, alloys thereof, carbon paper, carbon cloth, solid carbon, graphitic carbon, platinum-carbon composite, and combinations thereof. Furthermore, the electrodes may independently be solid or porous materials.

In some embodiments, the positions of the first and second source electrodes and the first and second sense electrodes are adjustable such that they may be positioned accurately on electrolytes of varying sizes and shapes. During operation of the apparatus, the first and second source electrodes and the first and second sense electrodes may be positioned adjacent the electrolyte to be tested.

Exemplary dimensions of the electrodes and electrolyte, as well as exemplary distances between the electrodes are discussed above and are relevant to the presently discussed apparatus.

In the present method and apparatus, the two source electrodes provide the driving DC or AC (measurement) current. That is, a DC or AC current is forced between the two source electrodes. The voltage sense electrodes are then used to measure the ohmic voltage drop across the electrolyte being tested. The driving current applied through the source electrodes and the voltage ohmic drop across the electrolyte measured by the sense electrodes is used to determine the electrolyte's resistance and/or conductance. The driving current/voltage signal may be either a direct current (DC) or alternating (AC) type signal.

As previously discussed, the first and second source electrodes overlap for some distance. Because the electrolyte is thin (in accordance with the previously discussed dimensions), the current passing between the two source electrodes is nearly ideally confined to the source electrode overlap area. The source electrodes themselves may have a high electrical conductivity and, therefore, the interfacial potential (potential at electrode-electrolyte interface) is equipotential at all points along the length and width of the source electrode. Because current does not pass through the electrolyte outside the source electrode overlap region, there is no potential gradient in the electrolyte outside the source overlap region. The potential of the electrolyte outside the overlap region, the potential at the source electrode-electrolyte interface, and the potential at the corresponding sense electrode-electrolyte interface is the same. That is, the potential at the voltage sense electrode is essentially identical to the potential at the corresponding source electrode-electrolyte interface. By measuring the voltage between the two sense electrodes, therefore, one is effectively measuring the voltage drop across the electrolyte in the through-thickness orientation that results from application of the driving current between the two source electrodes.

The present method and apparatus may be utilized with bare electrolytes, as well as catalyzed electrolytes. A catalyzed electrolyte implies an electrolyte having integrated electrodes on either side as used, for example, in a fuel cell.

Additionally, the present method and apparatus allows measurement of the through-thickness conductance or resistance in environments that mimic the working environment of the electrolytes being tested. For example, in fuel cell applications, proton exchange membranes (PEMs) are exposed to gaseous reactants (e.g., humidified $H_2$ fuel and air or oxygen at the anode and cathode, respectively). In the present method, the resistance of the electrolyte may be measured in humidified gaseous environments as opposed to using an additional liquid "electrolyte" on either side of the membrane within which Luggin reference electrode probes could reside near the membrane surface (i.e., a classic aqueous electrochemical cell). As such, to make the measurement of the electrolyte resistance under gas environments, the electrodes should be in direct contact with the electrolyte. The present method and apparatus enable such testing, in accordance with the description provided above.

The present method and apparatus provide significant advantages over prior-art testing methods. For example, the present method and apparatus provide accurate, direct measurement of a fundamental property of interest of electrolytes (i.e., through-thickness resistance or conductance) for a wide range of applications due to the novel geometry used in the present method and apparatus. This provides time and cost savings for electrolyte material developers, as well as increased manufacturing efficiency. The present method and apparatus may be utilized with as-manufactured, untreated electrolytes (i.e., uncatalyzed), with little or no additional processing required. Moreover, the present testing method may be non-destructive to the electrolyte, is easy to use and implement, having a simple set-up and tear-down procedure, and is available for measurement of a wide range of thin electrolytes.

Other embodiments within the scope of the specification and claims herein will be apparent to one skilled in the art from consideration of the specification or practice of the invention as disclosed herein. It is intended that the specification be considered to be exemplary only, with the scope and spirit of the invention being indicated by the claims.

All references cited in this specification, including without limitation, all papers, publications, patents, patent applications, presentations, texts, reports, manuscripts, brochures, books, internet postings, journal articles, periodicals, and the like, are hereby incorporated by reference into this specification in their entireties.

The discussion of the references herein is intended merely to summarize the assertions made by their authors and no admission is made that any reference constitutes prior art. Applicants reserve the right to challenge the accuracy and pertinency of the cited references.

Although preferred embodiments of the invention have been described using specific terms, devices, and methods, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of the various embodiments may be interchanged both in whole or in part.

What is claimed is:

1. A method for measuring the through-thickness resistance or conductance of a thin electrolyte, the method comprising:
    positioning a first source electrode on a first side of an electrolyte;
    positioning a second source electrode on a second side of the electrolyte, wherein the second side is opposite the first side and wherein the first and second source electrodes partially overlap;
    positioning a first sense electrode, corresponding to the first source electrode, on the second side of the electrolyte, wherein the first sense electrode is positioned such that it is in contact with the second side of the electrolyte opposite a non-overlapping portion of the first source electrode and is not in direct physical or electrical contact with the second source electrode;
    positioning a second sense electrode, corresponding to the second source electrode, on the first side of the electrolyte, wherein the second sense electrode is positioned such that it is in contact with the first side of the electrolyte opposite a non-overlapping portion of the second source electrode and is not in direct physical or electrical contact with the first source electrode;
    passing a driving DC or AC current between the first and second source electrodes;
    measuring the resulting DC or AC voltage between the first and second sense electrodes;
    calculating the through-thickness resistance or conductance based on the DC or AC current and the measured DC or AC voltage; and
    outputting the through-thickness resistance or conductance.

2. The method according to claim 1, wherein the electrolyte has a thickness that is less than about ⅓ the distance between the first sense electrode and the second source electrode.

3. The method according to claim 1, wherein the electrolyte has a thickness that is less than about ⅓ the distance between the second sense electrode and the first source electrode.

4. The method according to claim 1, wherein the overlap of the first and second source electrodes is at least about three times greater than the thickness of the electrolyte to be tested.

5. The method according to claim 1, wherein the distance between the first source electrode and the second sense electrode is at least about three times the thickness of the electrolyte to be tested.

6. The method according to claim 1, wherein the non-overlap of the first and second source electrodes is at least about three times greater than the thickness of the electrolyte to be tested.

7. The method according to claim 1, wherein the distance between the second source electrode and the first sense electrode is at least about three times the thickness of the electrolyte to be tested.

8. The method according to claim 1, wherein the width of the first and second source electrodes is at least about three times the thickness of the electrolyte to be tested.

9. The method according to claim 1, wherein the first sense electrode is in the form of a wire.

10. The method according to claim 9, wherein the first sense electrode has a diameter of at least about one micron.

11. The method according to claim 1, wherein the second sense electrode is in the form of a wire.

12. The method according to claim 11, wherein the second sense electrode has a diameter of at least about one micron.

13. The method according to claim 1, wherein the electrodes are independently selected from non-reactive electrical conductors.

14. The method according to claim 3, wherein the non-reactive electrical conductors are solid or porous and are selected from the group consisting of platinum, gold, silver, nickel, ruthenium, alloys thereof, carbon paper, carbon cloth, solid carbon, graphitic carbon, platinum-carbon composite, and combinations thereof.

15. An apparatus for measuring the through thickness resistance of an electrolyte, the apparatus comprising:
    a first source electrode;
    a second source electrode;
    a first sense electrode;
    a second sense electrode;
    one or more of the group consisting of a current source for applying a DC or AC current between the first source electrode and the second source electrode and a voltage source for applying a DC or AC voltage between the first sense electrode and the second sense electrode; and
    one or more of a current measuring device for measuring the DC or AC current between the first source electrode and the second source electrode and a voltage measuring device for measuring the DC or AC voltage between the first sense electrode and the second sense electrode; and
    a computer in communication with the current measuring device and voltage measuring device for calculating and outputting the through thickness resistance of the solid electrolyte wherein the first and second source electrodes and the first and second sense electrodes are positioned adjacent an electrolyte to be tested and wherein the first source electrode is positioned adjacent a first side of the electrolyte to be tested and the second source electrode is positioned adjacent a second side of the electrolyte to be tested, and wherein the second side of the electrolyte is opposite the first side of the electrolyte.

16. The apparatus according to claim 15, further comprising a host computer in communication with the apparatus for monitoring and/or controlling the apparatus.

17. The apparatus according to claim 15, further comprising a test chamber.

18. The apparatus according to claim 17, wherein the test chamber includes a gas inlet and outlet for controlling the environment of the test chamber.

19. The apparatus according to claim 17, wherein the test chamber includes a humidity sensor.

20. The apparatus according to claim 17, wherein the first and second source electrodes and the first and second sense electrodes are positioned inside the test chamber.

21. The apparatus according to claim 15, wherein the electrolyte to be tested is selected from the group consisting of solid, liquid, or semi-liquid electrolytes.

22. The apparatus according to claim 15, wherein the first sense electrode is positioned adjacent the second side of the electrolyte to be tested and the second sense electrode is positioned adjacent the first side of the electrolyte to be tested.

23. The apparatus according to claim 22, wherein the first sense electrode is positioned opposite the second source electrode and at least some distance from the first source electrode.

24. The apparatus according to claim 22, wherein the second sense electrode is positioned opposite the first source electrode and at least some distance from the second source electrode.

25. An apparatus for measuring the through thickness resistance of a solid electrolyte, the apparatus comprising:
- a first source electrode;
- a second source electrode;
- a first sense electrode;
- a second sense electrode;
- a cell head, the cell head having one or more of integrated electrode and specimen holders, electrode-electrolyte clamping device, temperature probes, and electrode leads;
- one or more of the group consisting of a current source for applying a DC or AC current between the first source electrode and the second source electrode and a voltage source for applying a DC or AC voltage between the first sense electrode and the second sense electrode; and
- one or more of a current measuring device for measuring the DC or AC current between the first source electrode and the second source electrode and a voltage measuring device for measuring the DC or AC voltage between the first sense electrode and the second sense electrode; and
- a computer in communication with the current measuring device and voltage measuring device for calculating and outputting the through thickness resistance of the solid electrolyte.

26. The apparatus according to claim 25, wherein the first and second source electrodes and the first and second sense electrodes are independently selected from the group consisting of non-reactive, electrical conductors.

27. The apparatus according to claim 26, wherein the non-reactive, electrical conductors are solid or porous and are selected from the group consisting of platinum, gold, silver, nickel, ruthenium, alloys thereof, carbon paper, carbon cloth, solid carbon, graphitic carbon, platinum-carbon composite, and combinations thereof.

28. An apparatus for measuring the through thickness resistance of a solid electrolyte, the apparatus comprising:
- a first source electrode;
- a second source electrode;
- a first sense electrode;
- a second sense electrode;
- one or more of the group consisting of a current source for applying a DC or AC current between the first source electrode and the second source electrode and a voltage source for applying a DC or AC voltage between the first sense electrode and the second sense electrode; and
- one or more of a current measuring device for measuring the DC or AC current between the first source electrode and the second source electrode and a voltage measuring device for measuring the DC or AC voltage between the first sense electrode and the second sense electrode; and
- a computer in communication with the current measuring device and voltage measuring device for calculating and outputting the through thickness resistance of the solid electrolyte wherein the first and second source electrodes and the first and second sense electrodes are positioned adjacent an electrolyte to be tested and wherein the first source electrode and the second source electrode are positioned such that there is at least some overlap between the first and second source electrodes.

* * * * *